United States Patent
Kitayama et al.

(10) Patent No.: US 8,149,069 B2
(45) Date of Patent: Apr. 3, 2012

(54) LOW-NOISE VOLTAGE-CONTROLLED OSCILLATING CIRCUIT

(75) Inventors: Yasuo Kitayama, Chitose (JP); Hiroyuki Demura, Chitose (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 107 days.

(21) Appl. No.: 12/801,421

(22) Filed: Jun. 8, 2010

(65) Prior Publication Data

US 2010/0308929 A1 Dec. 9, 2010

(30) Foreign Application Priority Data

Jun. 8, 2009 (JP) ............................. P.2009-137114

(51) Int. Cl.
*H03B 5/08* (2006.01)
(52) U.S. Cl. ............ 331/167; 331/107 SL; 331/117 FE; 331/117 R
(58) Field of Classification Search .................. 331/167, 331/117 R, 117 FE, 177 V, 107 SL
See application file for complete search history.

(56) References Cited

U.S. PATENT DOCUMENTS

| 7,532,080 B2 * | 5/2009 | Rhode et al. | 331/117 R |
| 7,636,021 B2 * | 12/2009 | Rohde et al. | 331/167 |

FOREIGN PATENT DOCUMENTS

| JP | 04-288707 | 10/1992 |
| JP | 08-107309 | 4/1996 |
| JP | 09-191215 | 7/1997 |
| JP | 11-225020 | 8/1999 |

* cited by examiner

*Primary Examiner* — Arnold Kinkead
(74) *Attorney, Agent, or Firm* — Jacobson Holman PLLC

(57) ABSTRACT

A low noise voltage-controlled oscillating circuit which can remove a power source noise to improve low frequency noise characteristics is disclosed. A capacitor C11 is provided between a base of a driving transistor Q1 and GND, whereby a low frequency noise input into the base can be removed. As the driving transistor Q1, a transistor having a low hFE is used, whereby the low frequency noise input from a power source can be removed. A coil L3 is provided on the emitter side of an oscillating transistor Q2, whereby broadband frequency characteristics can be obtained to improve phase noise frequency characteristics. On the emitter side of the oscillating transistor Q2, a resonance frequency in a resonant circuit having a capacitor C7 and the coil L3 is set near the center of a VCO oscillation frequency band, whereby it is possible to obtain the oscillation frequency which is not easily influenced by the noise.

18 Claims, 4 Drawing Sheets

LOW-NOISE VOLTAGE-CONTROLLED OSCILLATING CIRCUIT

This application has a priority of Japanese no. 2009-137114 filed Jun. 8, 2009, hereby incorporated by reference.

BACKGROUND OF THE INVENTION

1. Field of the Invention

The present invention relates to a voltage-controlled oscillating circuit. More particularly, it relates to a low noise voltage-controlled oscillating circuit which removes the noise of a power source to improve low frequency noise characteristics.

2. Description of the Related Art

[Prior Art]

A conventional voltage-controlled oscillating circuit (the voltage-controlled oscillator: VCO) is a circuit which varies an oscillation frequency in accordance with a direct-current voltage applied to a control terminal.

Moreover, the conventional VCO has a constitution directly connected to an external power source sometimes, and the VCO having such a constitution is influenced by the power source noise of the external power source, especially by the noise having a frequency which is as low as several kHz or less as it is, so that phase noise characteristics in such a band deteriorate.

[Deterioration of Phase Noise Characteristics due to Power Source Noise: FIG. 4]

The deterioration of the phase noise characteristics due to the power source noise in the conventional VCO will be described with reference to FIG. 4. FIG. 4 is a diagram showing the deterioration of the phase noise characteristics due to the power source noise. In FIG. 4, the abscissa indicates a frequency (the offset frequency), and the ordinate indicates the phase noise.

Moreover, as shown in FIG. 4, as to the deterioration of the phase noise characteristics due to the power source noise in the conventional VCO, a lower curve indicates the characteristics which are not influenced by the power source noise, and an upper curve indicates the characteristics influenced by the power source noise. The characteristics influenced by the power source noise comparatively deteriorate.

[Use Method of VCO for decreasing Power Source Noise: FIG. 5]

To prevent the above deterioration of the phase noise characteristics due to the power source noise, it is considered that a ripple filter circuit, a large-capacity low equivalent series resistance (ESR) capacitor and the like are used in the power source as shown in FIG. 5.

FIG. 5 is a diagram showing a use method of the VCO in which the power source noise has been decreased.

In FIG. 5, a ripple filter circuit 200 is inserted into a power source terminal of a VCO 100, and the power source terminal is further connected to a low ESR capacitor.

The ripple filter circuit 200 comprises a transistor Tr including a collector connected to a power source and an emitter connected to a power source input terminal of the VCO 100, the collector is connected to a base via a resistor R, and the base is connected to one end of a capacitor C having the other end connected to ground.

[Prior Art]

It is to be noted that examples of a concerned prior art include Japanese Patent Application Laid-Open No. 08-107309 titled "Voltage-controlled Oscillating Circuit" (applicant: Toshiba Corp.) [Patent Document 1], Japanese Patent Application Laid-Open No. 09-191215 titled "Voltage-controlled Oscillating Unit" (applicant: Mitsubishi Electric Corp.) [Patent Document 2], and Japanese Patent Application Laid-Open No. 11-225020 titled "VCO Circuit" (applicant: Murata Mfg. Co., Ltd.) [Patent Document 3].

Patent Document 1 discloses a voltage-controlled oscillating circuit in which a capacitor C10 is connected to a base of an amplifying transistor Tr2 of a buffer amplifier circuit section 1 to connect the base to ground in terms of a low frequency alternate current, and the buffer amplifier circuit section 1 operates as a ripple filter with respect to a low frequency noise applied to the section through a power source terminal B, and operates as a usual amplifier with respect to a signal applied from an oscillating circuit section 2.

Patent Document 2 discloses a voltage-controlled oscillating unit in which a collector of a transistor is connected to ground in terms of a high frequency, and a high pass filter is inserted as a phase advance circuit for canceling a phase lag, whereby an output frequency can be extracted as a low phase noise signal in the vicinity of a resonance frequency of an inductor resonator.

Patent Document 3 discloses a VCO circuit in which a resistor 4, an inductor 12, a resonator 13 and a capacitor 7 are connected in series between an input terminal 3 and a base of a transistor 8 as a resonant circuit, and a connecting point between the resistor 4 and the inductor 12 is connected to one end of a variable capacitor 6 having the other end connected to ground. An output of the resonant circuit is given to a tank circuit 2, and a parallel circuit constituted of a resistor 14, an inductor 15 and a resistor 16 is connected in series between an emitter of the transistor 8 and the ground.

SUMMARY OF THE INVENTION

However, in the above conventional voltage-controlled oscillating circuit (the VCO), a ripple filter circuit needs to be interposed between an external power source and the VCO to decrease a power source noise, and a low ESR capacitor needs to be provided. In recent years, the miniaturization of electronic components has been demanded, but at present there is a problem that a single VCO unit or a phase locked loop (PLL) synthesizer using the VCO cannot realize the miniaturization.

Moreover, in Patent Document 1, the buffer amplifier circuit section merely functions as the ripple filter, and Patent Documents 2 and 3 intend to decrease the noise, but do not remove a low frequency noise from a power source.

The present invention has been developed in view of the above situations, and an object thereof is to provide a low noise voltage-controlled oscillating circuit which can remove a power source noise to improve low frequency noise characteristics.

To solve the problems of the above conventional examples, according to the present invention, there is provided a voltage-controlled oscillating circuit comprising: a driving transistor including an emitter to which a power source voltage is supplied through a first resistor and a base to which a voltage obtained by dividing the power source voltage is applied; an oscillating transistor including a base connected to a collector of the driving transistor to perform an oscillating operation; a filter circuit into which an output from a collector of the oscillating transistor is branched and input and which limits the band of the output to return the output to the base of the oscillating transistor, thereby regulating the voltage supplied to the base by a control voltage from the outside; and a buffer amplifier which amplifies the output from the collector of the oscillating transistor, wherein the base of the driving transistor is connected to one end of a first capacitor having the other end connected to ground, a transistor having a direct-current amplification factor smaller than that of a usual driving transistor is used as the driving transistor, the emitter of the driving transistor is connected to the collector of the oscillating transistor via a second resistor and a first coil which are connected in parallel, and an emitter of the oscillating transistor is connected to one end of a second coil having the other end connected to the ground, which produces effects that a noise current in the driving transistor is lowered to diminish an influence on the oscillating transistor and that broadband frequency characteristics can be achieved to improve phase noise frequency characteristics.

Moreover, according to the present invention, in the above voltage-controlled oscillating circuit, a second capacitor is connected in series between the emitter of the oscillating transistor and the second coil to form a resonant circuit of the second coil and the second capacitor, and a resonance frequency in the resonant circuit is set near the center of an oscillation frequency band, thereby producing an effect that it is possible to obtain an oscillation frequency which is not easily influenced by the noise.

Furthermore, according to the present invention, in the above voltage-controlled oscillating circuit, the filter circuit comprises a low pass filter in which a coil is connected in series to a line connecting an input terminal to an output terminal and which is provided with variable capacity diodes including cathodes connected to the line and anodes connected to the ground, and the control voltage is applied to both ends of the coil.

In addition, according to the present invention, in the above voltage-controlled oscillating circuit, the coil in the filter circuit is a strip line.

DESCRIPTION OF REFERENCE NUMERALS

1 . . . IC, 10 . . . filter circuit, 100 . . . VCO, 200 . . . ripple filter circuit, Q1 . . . driving transistor, and Q2 . . . oscillating transistor.

DESCRIPTION OF THE PREFERRED EMBODIMENT

An embodiment of the present invention will be described with reference to the drawings.

Outline of Embodiment

A voltage-controlled oscillating circuit according to the embodiment of the present invention is a voltage-controlled oscillating circuit comprising a driving transistor including an emitter to which a power source voltage is supplied through a first resistor and a base to which a voltage obtained by dividing the power source voltage is applied; an oscillating transistor including a base connected to a collector of the driving transistor to perform an oscillating operation; a filter circuit into which an output from a collector of the oscillating transistor is branched and input and which limits the band of the output to return the output to the base of the oscillating transistor, thereby regulating the voltage supplied to the base by a control voltage from the outside; and a buffer amplifier which amplifies the output from the collector of the oscillating transistor, wherein the base of the driving transistor is connected to one end of a first capacitor having the other end connected to ground, a transistor having a direct-current amplification factor smaller than that of a usual driving transistor is used as the driving transistor, the emitter of the driving transistor is connected to the collector of the oscillating transistor via a second resistor and a first coil which are connected in parallel, and an emitter of the oscillating transistor is connected to one end of a second coil having the other end connected to the ground, whereby a noise current in the driving transistor is lowered to diminish an influence on the oscillating transistor, and broadband frequency characteristics can be achieved to improve phase noise frequency characteristics.

Moreover, in the voltage-controlled oscillating circuit according to the embodiment of the present invention, a second capacitor is connected in series between the emitter of the oscillating transistor and the second coil to form a resonant circuit of the second coil and the second capacitor, and a resonance frequency in the resonant circuit is set near the center of an oscillation frequency band, whereby it is possible to obtain an oscillation frequency which is not easily influenced by the noise.

It is to be noted that as to correspondence between a constitution in claims and the constitution of the embodiment, the first resistor corresponds to R6, the first capacitor corresponds to C11, the second resistor corresponds to R7, the first coil corresponds to L1, the second coil corresponds to L3, and the second capacitor corresponds to C7.

Figure 1:
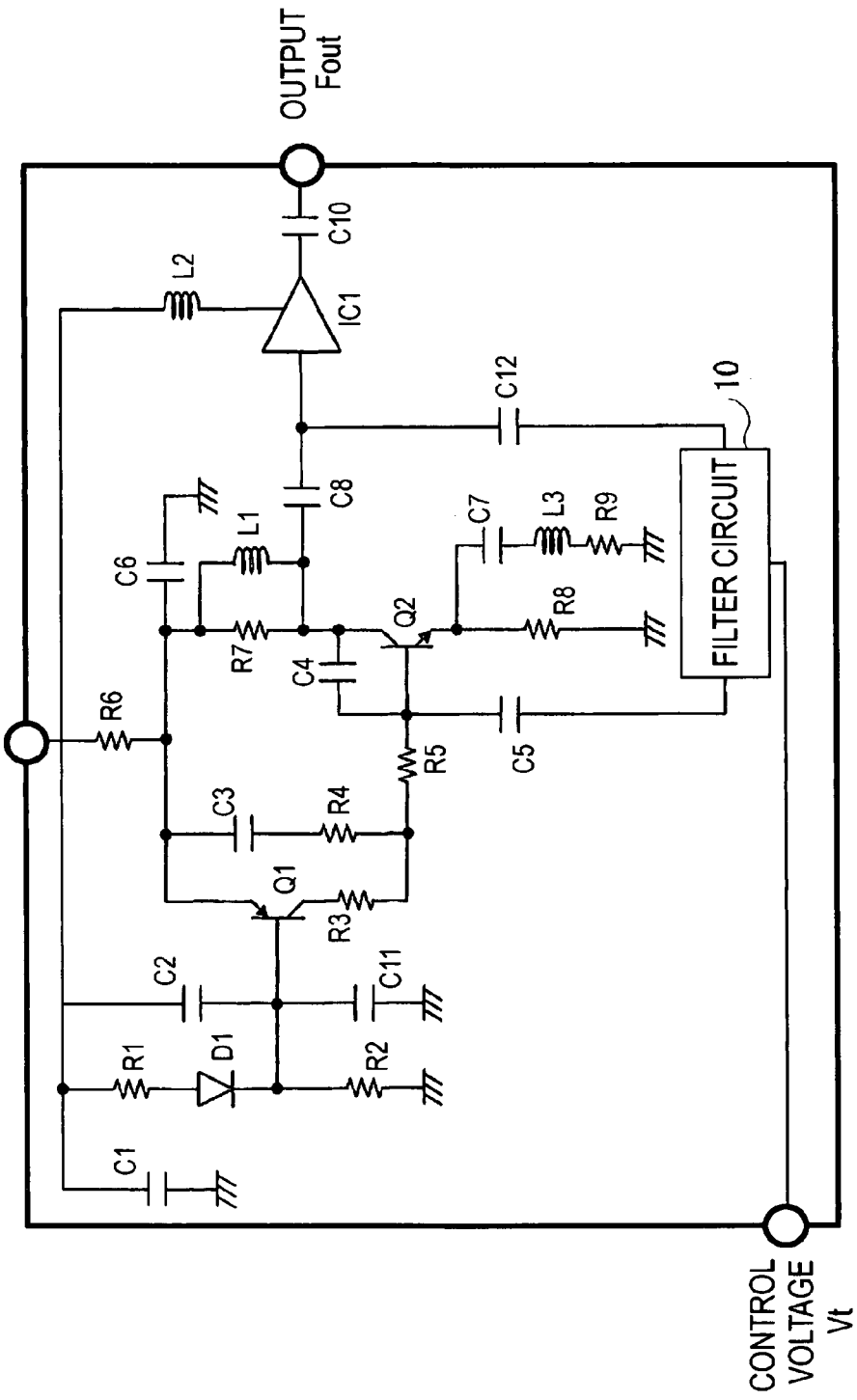
FIG. 1 is a constitution block diagram of a voltage-controlled oscillating circuit according to an embodiment of the present invention.

[Voltage-controlled Oscillating Circuit: FIG. 1]

The voltage-controlled oscillating circuit according to the embodiment of the present invention will be described with reference to FIG. 1. FIG. 1 is a constitution block diagram of the voltage-controlled oscillating circuit according to the embodiment of the present invention.

As shown in FIG. 1, the voltage-controlled oscillating circuit according to the embodiment of the present invention (the present circuit) comprises a terminal (the power source terminal) into which a power source voltage Vcc is input, a terminal (the control voltage terminal) into which a control voltage Vt is input and a terminal (the output terminal) through which an output Fout is output, and basically includes a driving transistor Q1, an oscillating transistor Q2, a buffer amplifier IC1 and a filter circuit 10.

Moreover, an output from a collector of the oscillating transistor Q2 is returned to a base thereof through the filter circuit 10, thereby causing oscillation, and the cutoff frequency of the filter circuit 10 can be varied by the control voltage Vt to regulate an oscillation frequency.

Furthermore, as to the load of the oscillating transistor Q2 on a collector side, the coil L1 is dumped at the resistor R7 to broaden a frequency band.

[Connecting Relation]

A connecting relation in the present circuit will specifically be described.

As the driving transistor Q1, a transistor having a small direct-current amplification factor (hFE) is used.

The power source terminal is connected to ground via a resistor R1, a diode D1 and a resistor R2 which are connected in series.

Moreover, a point connecting the cathode side of the diode D1 to the resistor R2 is connected to a base of the driving transistor Q1.

Furthermore, a point of the resistor R1 on the side of the power source terminal is connected to one end of a capacitor C1 having the other end connected to the ground.

In addition, the power source terminal is connected to the base of the driving transistor Q1 via a capacitor C2, and the base is connected to the ground via the capacitor C11.

Moreover, the power source terminal is connected to an emitter of the driving transistor Q1 via the resistor R6. The resistor R6 is an emitter resistor of the driving transistor Q1.

A collector of the driving transistor Q1 is connected to the base of the oscillating transistor Q2 via resistors R3 and R5 which are connected in series.

The emitter of the driving transistor Q1 is connected to a point between the resistor R3 and the resistor R5 via a capacitor C3 and a resistor R4 which are connected in series.

Moreover, a collector of the oscillating transistor Q2 is connected to the base thereof via a capacitor C4, and the base is connected to the output side of the filter circuit 10 via a capacitor C5.

A point connecting the resistor R6 to the capacitor C3 is connected to the collector of the oscillating transistor Q2 via the resistor R7 and the coil L1 which are connected in parallel.

Furthermore, a point between the parallel connection of the resistor R7 and the coil L1 and the resistor R6 is connected to the ground via a capacitor C6.

The collector of the oscillating transistor Q2 is connected to the input side of the buffer amplifier IC1 via a capacitor C8, and the output side of the buffer amplifier IC1 is connected to the output terminal via a capacitor C10.

Moreover, the power source voltage is supplied to the buffer amplifier IC1 through a coil L2.

A point between the capacitor C8 and the input side of the buffer amplifier IC1 is connected to the input side of the filter circuit 10 via a capacitor C12.

Furthermore, a resistor R8, and the capacitor C7, the coil L3 and a resistor R9 connected in series are connected in parallel with an emitter of the oscillating transistor Q2, and the other ends of them are connected to the ground.

[Contrivance of Removal of Power Source Noise]

A characteristic part concerning the removal of the power source noise in the present circuit will be described.

Firstly, in addition to the capacitors C1 and C2, the capacitor C11 is provided between the base of the driving transistor Q1 and the ground (GND), thereby removing a low frequency noise input from the power source to the base of the driving transistor Q1.

In this case, when the low frequency noise is input from the power source, a noise current flows through the base of the driving transistor Q1, and hence the low frequency noise is removed by the capacitor C11.

Secondly, the transistor used as the driving transistor Q1 is a transistor having a low hFE as compared with the conventional driving transistor, thereby decreasing the low frequency noise input from the power source into the oscillating transistor Q2.

In this case, the resistor R6 is the emitter resistor of the driving transistor Q1. Therefore, when the low frequency noise is input from the power source, the noise current flows through the base of the driving transistor Q1, and the noise current flows through the resistor R6. Consequently, a current obtained by multiplying the noise current by the factor hFE flows through the collector of the driving transistor Q1, and the base of the oscillating transistor Q2 is influenced. Furthermore, the noise current increases at the oscillating transistor Q2, thereby increasing the noise current of the resistor R6. In consequence, feedback occurs to increase the noise current of the driving transistor Q1.

Therefore, when the transistor having the low hFE is used as the driving transistor Q1, the influence of the noise current on the oscillating transistor Q2 can be diminished.

Specifically, the factor hFE of the driving transistor varies in accordance with the type thereof, but is usually from about 50 to 1000, and driving transistors of ranks of 50 to 200, 200 to 400, 400 to 800 and 600 to 1000 are manufactured.

In general, a transistor having a high hFE is usually used for the use application of high frequency amplification, but in the present circuit, the transistor having the lowest hFE is selected from the ranked transistors and used.

Thirdly, the coil L3 is provided on the emitter side of the oscillating transistor Q2 to obtain broadband frequency characteristics, thereby eliminating phase noise frequency characteristics (the f-characteristics).

Fourthly, on the emitter side of the oscillating transistor Q2, the resonance frequency in the resonant circuit constituted of the capacitor C7 and the coil L3 is set near the center of a VCO oscillation frequency band, whereby it is possible to obtain the oscillation frequency which is not easily influenced by the noise.

In this case, as a load on the collector side of the oscillating transistor Q2, the inductance of the coil L1 is dumped by the resistance value of the resistor R7 to broaden the frequency band (broadband), but the oscillating transistor Q2 on the emitter side has the frequency characteristics (the f-characteristics). Therefore, in the case of the broadband VCO, a resistance to the noise varies in accordance with the frequency, thereby generating an oscillation frequency easily influenced by the noise and an oscillation frequency which is not easily influenced by the noise.

To solve the problem, the resonance frequency of the resonant circuit constituted of the capacitor C7 and the coil L3 is set near the center of VCO oscillation frequency band, to generate the oscillation frequency which is not easily influenced by the noise.

Figure 2:
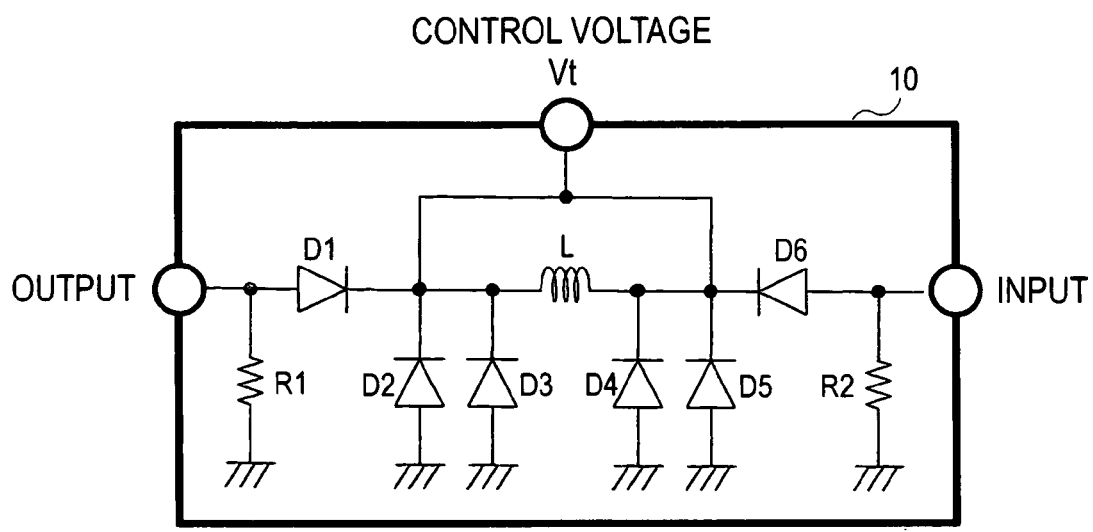
FIG. 2 is a circuit diagram of a filter circuit.

[Filter Circuit: FIG. 2]

Next, the filter circuit 10 in the present circuit will be described with reference to FIG. 2. FIG. 2 is a circuit diagram of the filter circuit.

As shown in FIG. 2, the filter circuit 10 comprises a terminal (a control voltage input terminal) into which the control voltage Vt is input, an input terminal and an output terminal, and from the input terminal to the output terminal, a variable capacity diode D6, a coil L and a variable capacity diode D1 are connected in series. The filter circuit further comprises variable capacity diodes D2 to D5 having an anode side connected to the ground and a cathode side connected to a line connecting the input terminal to the output terminal.

Specifically, a cathode of the variable capacity diode D1 is connected to the coil L, an anode thereof is connected to the output terminal, a cathode of the variable capacity diode D6 is connected to the coil L, and an anode thereof is connected to the input terminal.

Moreover, a point between the output terminal and the anode of the variable capacity diode D1 is connected to one end of a resistor R1 having the other end connected to the ground, and a point between the input terminal and the anode of the variable capacity diode D6 is connected to one end of a resistor R2 having the other end connected to the ground.

Furthermore, points between the cathode of the variable capacity diode D1 and the coil L are connected to cathodes of the variable capacity diodes D2 and D3, and anodes of the diodes are connected to the ground. Points between the cathode of the variable capacity diode D6 and the coil L are connected to cathodes of the variable capacity diodes D4 and D5, and anodes of the diodes are connected to the ground.

In addition, the control voltage input terminal is connected to both ends of the coil L, and the control voltage Vt is applied to both the ends of the coil L. The control voltage Vt is controlled to vary filter characteristics.

Here, the coil L may be a strip line.

In FIG. 2, the variable capacity diodes and the coil constitute a low pass filter.

Figure 3:
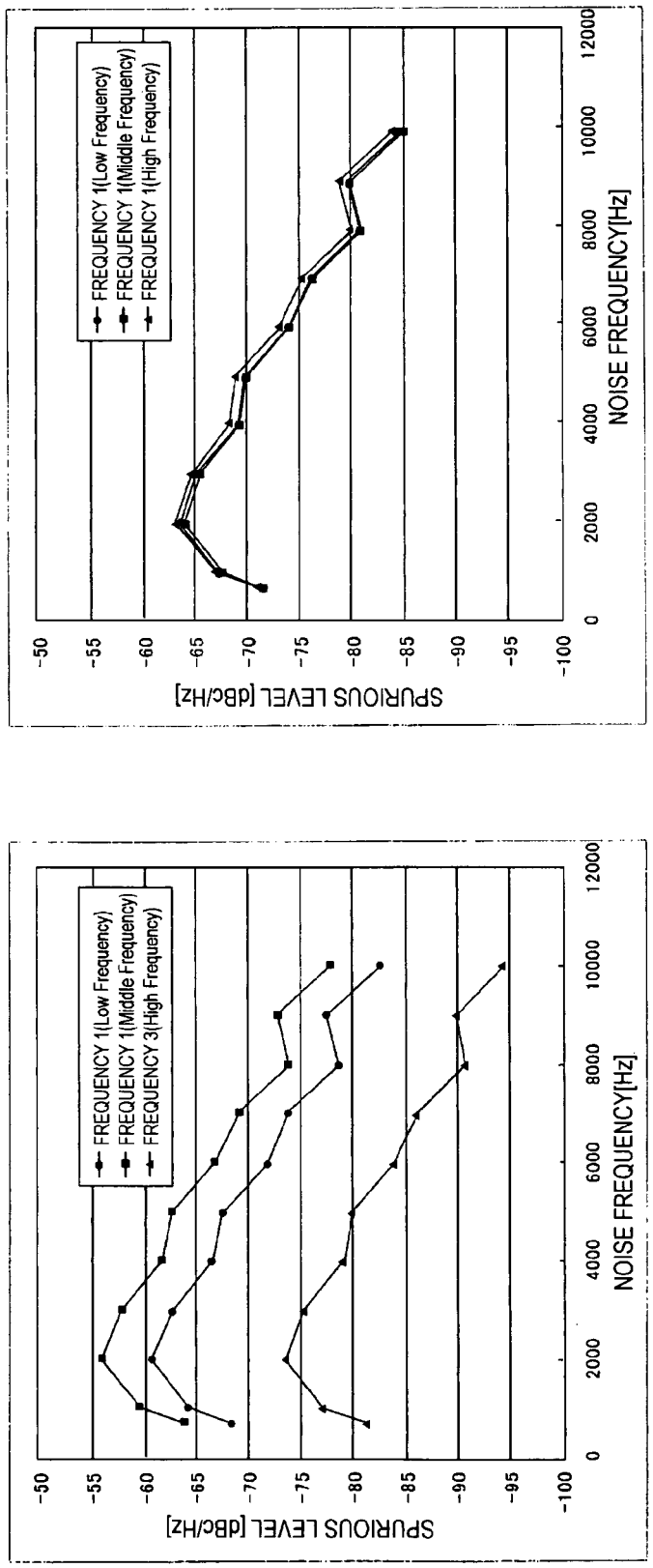
FIG. 3 is a diagram showing the noise resistance of a VCO.
Figure 4:
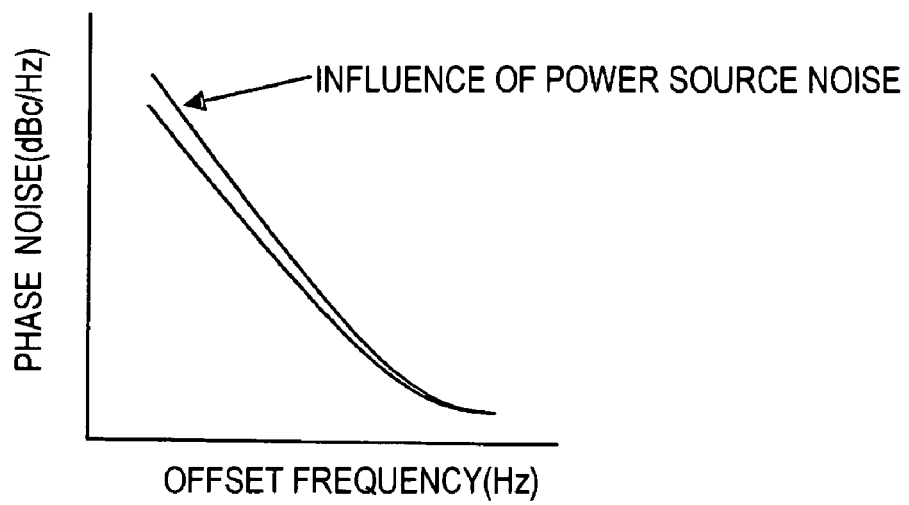
FIG. 4 is a diagram showing the deterioration of phase noise characteristics due to a power source noise.
Figure 5:
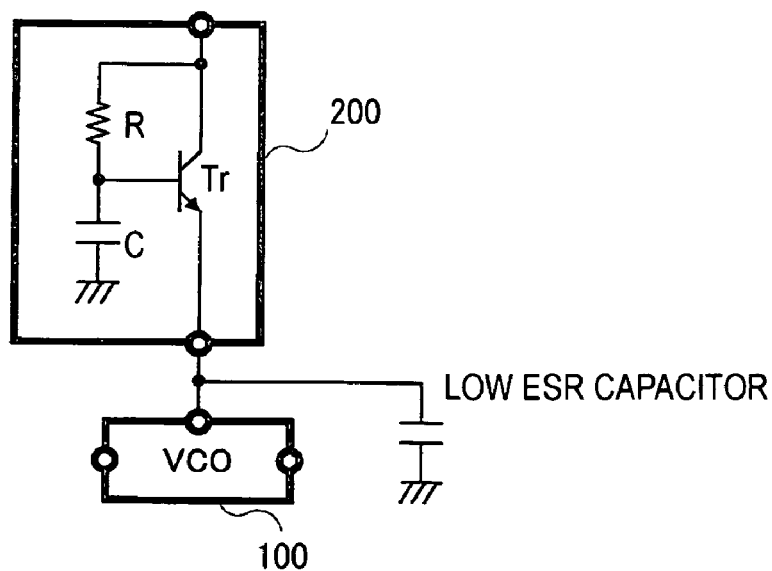
FIG. 5 is a diagram showing a use method of the VCO in which the power source noise has been decreased.

[Noise Resistance of VCO: FIG. 3]

Next, the noise resistance of the VCO in the present circuit will be described with reference to FIG. 3. FIG. 3 is a diagram showing the noise resistance of the VCO. In FIG. 3, for comparison with a conventional technology, left diagram (1) shows the noise resistance of a conventional VCO, and right diagram (2) shows the noise resistance of the present circuit. Moreover, the abscissa indicates a noise frequency [Hz], and the ordinate indicates a spurious level [dBc/Hz]. Moreover, in the diagrams, three cases of a low frequency, a middle frequency and a high frequency are shown.

In FIG. 3, as a pseudo low frequency noise, a signal of 700 Hz to 10 kHz is input from a function generator to a power source line of the VCO, and the spurious level which appears in the output of the VCO is measured.

The noise resistance of the conventional VCO varies in accordance with a low, middle or high oscillation frequency, and the VCO is easily influenced by the noise. However, the present circuit does not have any frequency characteristics due to the oscillation frequency, and its noise resistance improves.

It is to be noted that in the conventional circuit of FIG. 3(1), the factor hFE of the driving transistor is about 400, and in the present circuit of FIG. 3(2), the factor hFE of the driving transistor is about 150.

Effect of the Embodiment

According to the present circuit, the capacitor C11 is provided between the base of the driving transistor Q1 and GND, whereby the low frequency noise input into the base can be removed. As the driving transistor Q1, the transistor having the low hFE is used, whereby the low frequency noise input from the power source can be removed. The coil L3 is provided on the emitter side of the oscillating transistor Q2, whereby broadband frequency characteristics can be obtained to improve phase noise frequency characteristics. On the emitter side of the oscillating transistor Q2, the resonance frequency in the resonant circuit constituted of the capacitor C7 and the coil L3 is set near the center of a VCO oscillation frequency band, which produces an effect that it is possible to obtain the oscillation frequency which is not easily influenced by the noise.

INDUSTRIAL APPLICABILITY

The present invention is preferable for a low noise voltage-controlled oscillating circuit which can remove a power source noise to improve low frequency noise characteristics.

What is claimed is:

1. A voltage-controlled oscillating circuit comprising:
   a driving transistor including an emitter to which a power source voltage is supplied through a first resistor and a base to which a voltage obtained by dividing the power source voltage is applied;
   an oscillating transistor including a base connected to a collector of the driving transistor to perform an oscillating operation;
   a filter circuit into which an output from a collector of the oscillating transistor is branched and input and which limits the band of the output to return the output to the base of the oscillating transistor, thereby regulating the voltage supplied to the base by a control voltage from the outside; and
   a buffer amplifier which amplifies the output from the collector of the oscillating transistor,
   wherein the base of the driving transistor is connected to one end of a first capacitor having the other end connected to ground,
   a transistor having a direct-current amplification factor smaller than that of a usual driving transistor is used as the driving transistor,
   the emitter of the driving transistor is connected to the collector of the oscillating transistor via a second resistor and a first coil which are connected in parallel, and
   an emitter of the oscillating transistor is connected to one end of a second coil having the other end connected to the ground.

2. The voltage-controlled oscillating circuit according to claim 1, wherein a second capacitor is connected in series between the emitter of the oscillating transistor and the second coil to form a resonant circuit of the second coil and the second capacitor, and
   a resonance frequency in the resonant circuit is set near the center of an oscillation frequency band.

3. The voltage-controlled oscillating circuit according to claim 1, wherein the filter circuit comprises a low pass filter in which a coil is connected in series to a line connecting an input terminal to an output terminal and which is provided with variable capacity diodes including cathodes connected to the line and anodes connected to the ground, and the control voltage is applied to both ends of the coil.

4. The voltage-controlled oscillating circuit according to claim 2, wherein the filter circuit comprises a low pass filter in which a coil is connected in series to a line connecting an input terminal to an output terminal and which is provided with variable capacity diodes including cathodes connected to the line and anodes connected to the ground, and the control voltage is applied to both ends of the coil.

5. The voltage-controlled oscillating circuit according to claim 3, wherein the coil in the filter circuit is a strip line.

6. The voltage-controlled oscillating circuit according to claim 4, wherein the coil in the filter circuit is a strip line.

7. The voltage-controlled oscillating circuit according to claim 1, wherein the direct-current amplification factor of the driving transistor is set to a range of 50 to 200.

8. The voltage-controlled oscillating circuit according to claim 2, wherein the direct-current amplification factor of the driving transistor is set to a range of 50 to 200.

9. The voltage-controlled oscillating circuit according to claim 3, wherein the direct-current amplification factor of the driving transistor is set to a range of 50 to 200.

10. The voltage-controlled oscillating circuit according to claim 4, wherein the direct-current amplification factor of the driving transistor is set to a range of 50 to 200.

11. The voltage-controlled oscillating circuit according to claim 5, wherein the direct-current amplification factor of the driving transistor is set to a range of 50 to 200.

12. The voltage-controlled oscillating circuit according to claim 6, wherein the direct-current amplification factor of the driving transistor is set to a range of 50 to 200.

13. The voltage-controlled oscillating circuit according to claim 1, wherein the direct-current amplification factor of the driving transistor is set to a range of 50 to 100.

14. The voltage-controlled oscillating circuit according to claim 2, wherein the direct-current amplification factor of the driving transistor is set to a range of 50 to 100.

15. The voltage-controlled oscillating circuit according to claim 3, wherein the direct-current amplification factor of the driving transistor is set to a range of 50 to 100.

16. The voltage-controlled oscillating circuit according to claim 4, wherein the direct-current amplification factor of the driving transistor is set to a range of 50 to 100.

17. The voltage-controlled oscillating circuit according to claim 5, wherein the direct-current amplification factor of the driving transistor is set to a range of 50 to 100.

18. The voltage-controlled oscillating circuit according to claim 6, wherein the direct-current amplification factor of the driving transistor is set to a range of 50 to 100.

* * * * *